(12) United States Patent
Lee

(10) Patent No.: US 6,399,499 B1
(45) Date of Patent: Jun. 4, 2002

(54) METHOD FOR FABRICATING AN ELECTRODE OF A PLASMA CHAMBER

(76) Inventor: Jeong Gey Lee, 52-3, 171-7, Kaepo-dong, Kangnam-gu, Seoul (KR), 135-240

( * ) Notice: Subject to any disclaimer, the term of this patent is extended or adjusted under 35 U.S.C. 154(b) by 0 days.

(21) Appl. No.: 09/395,495

(22) Filed: Sep. 14, 1999

(51) Int. Cl.⁷ ............................................... H01L 21/302
(52) U.S. Cl. ...................... 438/692; 438/693; 438/745; 438/753
(58) Field of Search ............................ 156/345; 451/90, 451/66; 216/88–90; 438/690–694; 118/723

(56) References Cited

U.S. PATENT DOCUMENTS

| | | | | |
|---|---|---|---|---|
| 4,699,805 A | * | 10/1987 | Seelbach et al. ............. | 437/245 |
| 5,498,199 A | * | 3/1996 | Karlsrud et al. ............. | 451/289 |
| 5,655,956 A | * | 8/1997 | Ferreira et al. .............. | 451/143 |
| 5,895,583 A | * | 4/1999 | Augustine et al. ............ | 216/53 |
| 5,951,814 A | * | 9/1999 | Saito et al. .................. | 156/345 |
| 6,106,663 A | * | 8/2000 | Kuthi et al. ................. | 156/345 |
| 6,108,189 A | * | 8/2000 | Weldon et al. .............. | 361/234 |
| 6,237,528 B1 | * | 5/2001 | Szapucki et al. ........... | 118/723 |

* cited by examiner

*Primary Examiner*—Robert Kunemund
*Assistant Examiner*—Charlotte A. Brown
(74) *Attorney, Agent, or Firm*—Dann, Dorfman, Herrell and Skillman, P.C.

(57) ABSTRACT

Disclosed is a method for fabricating an electrode of a plasma chamber. According to the method, a circular silicon substrate is provided facing a drilling plate having a plurality of tips projected from one surface of the drilling plate. Afterwards, a polishing material containing a plurality of polishing particles is supplied on the circular silicon substrate and the drilling plate. Thereafter, an ultrasonic wave is applied to the drilling plate to vibrate the tips of the drilling plate. The plurality of polishing particles collide with the circular silicon plate during the vibration of the tips of the drilling plate and a plurality of fine through holes are thereby formed in the circular silicon plate.

10 Claims, 5 Drawing Sheets

METHOD FOR FABRICATING AN ELECTRODE OF A PLASMA CHAMBER

BACKGROUND OF THE INVENTION

1. Field of the Invention

The present invention generally relates to a method for fabricating an electrode of a plasma chamber, and more particularly to a method for fabricating a cathode electrode of a plasma chamber which is used for a thin film forming process or an etch process. The cathode electrode has a plurality of fine through holes formed by an ultrasonic technique and allows introduced gases to be dispersed into the chamber and additionally the surface flatness and hardness to be improved.

2. Description of the Related Art

Generally, in order to fabricate semiconductor devices using a silicon wafer as a substrate, various kinds of processes such as oxidation, diffusion, deposition, etch, photolithography, and ion implantation are essentially performed. Especially, deposition and etch processes are generally performed using plasma technologies.

When plasma technologies are applied in fabricating semiconductor devices, reaction gases within a process chamber are transformed into excited plasma gases by applying a radio frequency voltage to electrodes. The excited plasma gases react with a surface of a substrate, whereby thin film is deposited on the substrate or the surface of the substrate is etched.

With reference to FIG. 1, there is described a conventional plasma etch apparatus which is used for etching a surface of a silicon wafer. A cathode 14 and an anode 18 to each of which a radio frequency voltage 12 is applied are respectively disposed at an upper portion and a lower portion of a process chamber 10. In addition to the role as electrode, the anode also functions as a chuck to fix a wafer 16. A gas supply tube 26 for supplying an etch gas of a fluorine system and a circulation tube 20 through which cool water for cooling the heated cathode 26 circulates are respectively coupled to the cathode 14. A vacuum pump 22 is disposed at one side of the bottom portion of the chamber 10 and controls an ambient pressure of the chamber 10.

Gases which are supplied into the inside of the chamber 10 are ionized by a potential difference between radio frequency voltages respectively applied to the cathode 14 and the anode 18 and whereby they are transformed to plasma gases. The plasma gases react an upper surface of the wafer 16 to etch predetermined portions of the wafer 16.

In the above constituted plasma apparatus, an ambient condition such as a vacuum pressure, of the inside of the chamber 10 depends on performance of the vacuum pump 22 and cooling of the cathode 14 is performed by concurrently supplying cool water through the circulation tubes 20.

Referring to FIG. 2, the cathode 14 is made of a circular silicon plate and has a plurality of fine through holes 24 which are formed for the purposes of injecting the supply gases into the inside of the chamber 10. The plurality of fine through holes 24 are formed by a diamond drill.

In most of the semiconductor device fabrication processes, dirt particles are one of the most significant factors that determine production yield and are a very important checking item for all equipments used in the semiconductor device fabrication. However, the conventional cathode 14 has a drawback in that the fine through holes 24 of the cathode 14 act as a generating source of particles because the fine through holes 24 have inner wall and inlet portions that are very rough. In other words, while the reaction gases are supplied into the inside of the chamber 10 through the fine through holes of the cathode, particles are generated from the inner wall and inlet portion of the fine through holes 24 and are supplied into the inside of the chamber 10, whereby a process yield is lowered.

SUMMARY OF THE INVENTION

Accordingly, it is an object of the present invention to provide a method for fabricating an electrode of a plasma chamber capable of preventing particles from being generated from inner wall and inlet portion of the fine through holes formed in the electrode by forming the fine through holes using an ultrasonic technology.

To accomplish this object and other advantages, according to one aspect of the present invention, there is provided a method for fabricating an electrode of a plasma chamber. The method comprises the steps of: providing a circular silicon substrate facing a drilling plate having a plurality of tips projected from one surface of the drilling plate; supplying a polishing material containing a plurality of polishing particles on the circular silicon substrate and the drilling plate; and drilling a plurality of holes in the circular silicon substrate by colliding the plurality of polishing particles to selected portions of the circular silicon plate using an ultrasonic vibration of the tips of the drilling plate.

According to another aspect of the present invention, there is provided a method for fabricating an electrode of a plasma chamber comprising the steps of: providing a circular silicon substrate facing a drilling plate having a plurality of tips projected from one surface of the drilling plate; supplying a first polishing material containing a plurality of polishing particles on the circular silicon. substrate and the drilling plate; drilling a plurality of holes in the circular silicon substrate by colliding the plurality of polishing particles to selected portions of the circular silicon plate using an ultrasonic vibration of the tips of the drilling plate is performed by oscillations of an ultrasonic converter coupled to the other surface of the drilling plate; lapping the circular silicon plate to a first roughness using a lapping material; etching the circular silicon plate using an etch solution; polishing the circular silicon plate to a second roughness lower than the first roughness using a second polishing material; and cleaning the circular silicon plate.

It is preferable that the first polishing material has a roughness of 9 Moh or more.

It is preferable that the lapping material contains aplurality of lapping particles, the lapping particles having a diameter of 6–7 $\mu$m.

The lapping material is one selected from a group consisting of silica, silicon carbide, alumina or zirconium.

It is preferable that the etch solution is one selected from a group consisting of potassium hydroxide, nitric acid, and hydrochloric acid.

The second polishing material contains a plurality of polishing particles, the polishing particles having a diameter of 0.1 $\mu$m or less. The second polishing material is one selected from a group consisting of silica, silicon carbide, alumina, and zirconia.

It is preferable that the cleaning step comprises the steps of: dipping the circular silicon substrate in which the lapping step is completed in a first cleaning solution wherein oxygenated water is added to a heated ammonia water; dipping the circular silicon plate in a second cleaning solution wherein oxygenated water is added to a heated sulfuric acid; and cleaning the circular substrate by deionized water.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Reference will now be made in detail to the preferred embodiments of the present invention, examples of which are illustrated in the accompanying drawings where like numerals indicate the same or similar components.

The present invention applies an ultrasonic technology to the formation of an electrode for a plasma chamber and in the present embodiment, cathode electrode is used as one example of the electrode.

Figure 3:
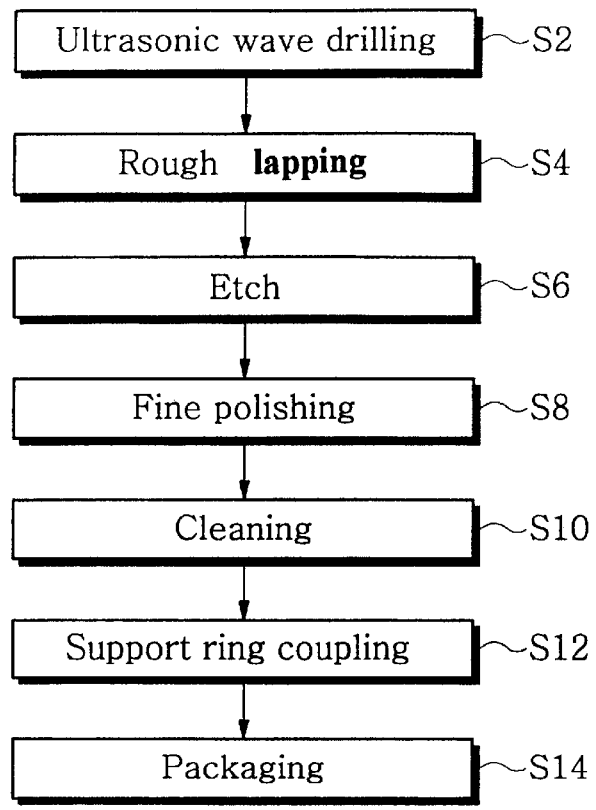
FIG. 3 is a flow chart showing a fabrication process of a cathode electrode according to one embodiment of the invention.

As shown in FIG. 3, an electrode for use as a cathode of a plasma chamber is fabricated by performing the following steps: an ultrasonic drilling step (S2); a rough lapping step (S4); an etch step (S6); a fine polishing step (S8); a water cleaning step (S10); a support ring coupling step (S12); and a packaging step (S14). Here, in order to perform the ultrasonic drilling step (S2), a drilling plate 30 having a plurality of drilling tips 32 formed on one surface thereof is used as shown in FIG. 4 and it is coupled to a drilling system as shown in FIG. 5.

Figure 4:
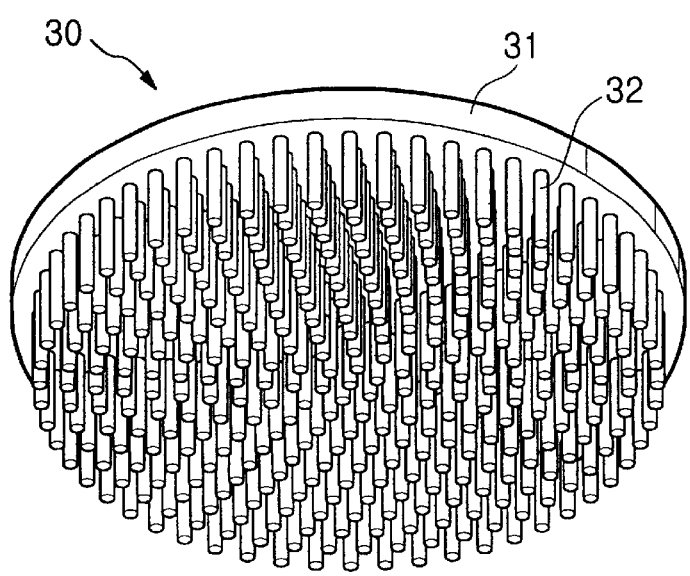
FIG. 4 is a perspective view of a drilling plate which is used in fabricating a cathode electrode to be applied to the present invention.

Referring to FIG. 4, the drilling plate 30 includes: a circular plate 31 having a predetermined diameter and a high durable hardness; and a plurality of tips 32 coupled normal to one surface of the circular plate 31 and having a selected length and diameter. It is preferable that the drilling plate 30 is made of a material having a sufficient hardness so as to be durable during ultrasonic drilling and that it is fabricated by a mold casting method.

Figure 5:
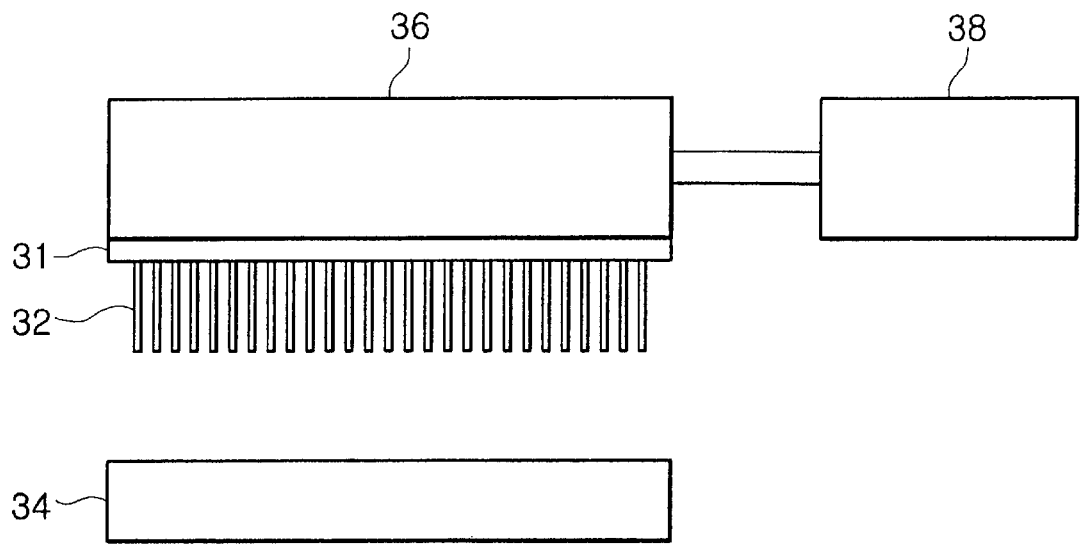
FIG. 5 is a block diagram for describing a method for forming fine through holes in a substrate for a cathode electrode using the drilling plate of the FIG. 4.
Figure 6:
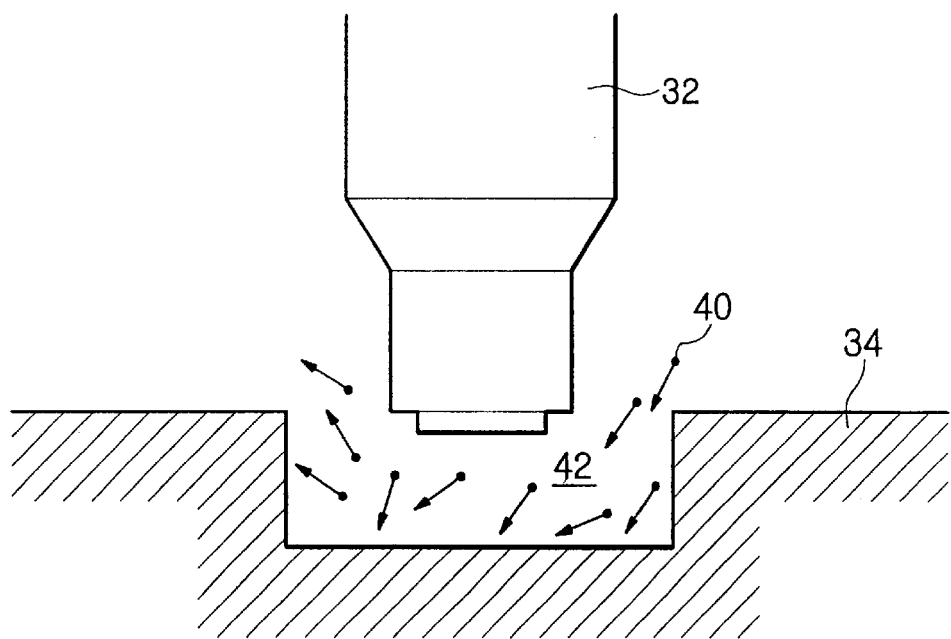
FIG. 6 is a schematic diagram showing a drilling mechanism by an ultrasonic technology.

Referring to FIG. 5, a drilling system includes: the drilling plate 30 shown in FIG. 4; an ultrasonic converter 36 coupled to the other surface of the circular plate 31; and a radio frequency power supply part 38 coupled to the ultrasonic converter 36. Below the drilling plate 32, there is disposed a circular plate substrate 32 to be made into a cathode electrode.

In the drilling system, ultrasonic waves are generated from the ultrasonic converter 36 which receives a radio frequency voltage from the radio frequency power supply part 38 and is then applied to the drilling plate 32.

Next, there is specifically described a method for fabricating an electrode of a plasma chamber according to one embodiment of the present invention with reference to the accompanying drawings of FIGS. 3–5.

The circular plate substrate 34 shown in FIG. 5 is made of P-type silicon in which boron atoms are implanted and preferably has a diameter range of 150 mm to 300 mm depending on the etching apparatus as applied and a thickness range of 0.5 mm to 20 mm. These diameters and thicknesses are not necessarily restricted to the above ranges and can be varied depending on equipments as used.

The circular plate substrate 34 is dipped in a container in which a mixed solution of water and a polishing material is filled. As the polishing material, one having hardness more than 9 Moh is selected considering that silicon used as the substrate 34 has a hardness of 8 Moh.

When a radio frequency power having a radio frequency of approximate 20 Khz is applied to the ultrasonic converter 36, the ultrasonic converter 36 oscillates with an ultrasonic wave. As the ultrasonic converter 36 oscillates, the drilling plate 32 vibrates in synchronism with the oscillation of the converter 36, whereby the drilling tips also vibrate.

As the drilling tips 32 vibrate, the polishing material fluctuates on the surface of the substrate 34 in synchronism with the vibration of the drilling tips 32. In more detail, polishing particles 40 contained in the polishing material collide with the surface of the substrate 34, whereby fine cylindrical grooves 42 start to be formed at selected portions of the substrate 34 corresponding to the end portions of the respective drilling tips 30 and neighboring portions of the respective drilling tips 32. As the ultrasonic drilling process progresses for a predetermined time, the fine cylindrical grooves 42 are penetrated through the substrate 34 to thereby form fine through holes.

Thereafter, a rough lapping step (S4) is performed. A colloid of silica, silicon carbide, alumina or zirconia particles each having a diameter of 6–7 µm is used as a lapping material for the rough lapping step (S4). Through the rough lapping step, particles or projected portions generated at portions adjacent to the through holes 24 of the substrate 34 during the ultrasonic drilling step (S2) are physically abraded and removed. Although the rough lapping step is completed, surface defects such as scratches still remain at the surface of the substrate 34 and surface portions adjacent to the through holes 24.

The remaining surface defects are removed through a chemical etch step (S6), whereby the surface of the substrate 34 becomes essentially flat. Moreover, damaged portions or projected portions generated at the inner wall surface of the fine through holes 24 are removed during the chemical etch step. Here, as an etch solution for performing the chemical etch step, one selected from a group consisting of potassium hydroxide, nitric acid, and hydrochloric acid is used.

The circular plate substrate 34 after which the etch step (S6) is completed is at a state that the surface of the circular plate substrate 34 and the inner wall surface are flattened to a selected flatness degree and projected portions or particles adsorbed on the surface of the inner wall of the through hole 24 acting as particle generating source later are removed.

Afterwards, a fine polishing step (S8) is performed whereby upper and lower surfaces of the substrate 34 and inner wall surfaces of the through holes 24 come to have a highly graded flatness. Here, a colloid of particles having a diameter of 0.1 µm or less is used for the fine polishing step (S8).

Thereafter, a cleaning step (S10) using pure water is performed in order to remove particles remaining on the surface of the circular substrate 34 after which the above described fine polishing step (S8) is completed.

The cleaning step may be divided into the following three steps. As a first step, the circular substrate 34 is dipped in a first cleaning solution wherein oxygenated water is added to a heated ammonia water. At this time, since the first cleaning solution is at a temperature range of approximately 30–90° C. having a plurality of bubbles, the particles are captured by the plurality of bubbles and removed.

As a second step, the circular substrate 34 is thereafter dipped in a second cleaning solution wherein oxygenated water is added to a sulfuric acid heated at 50–150° C. or more. At this time, the remaining particles are captured and removed by etch function of the sulfuric acid and capture function of the mixed solution by the generated bubbles.

As a third step, the circular substrate 34 is cleaned by deionized water.

Figure 1:
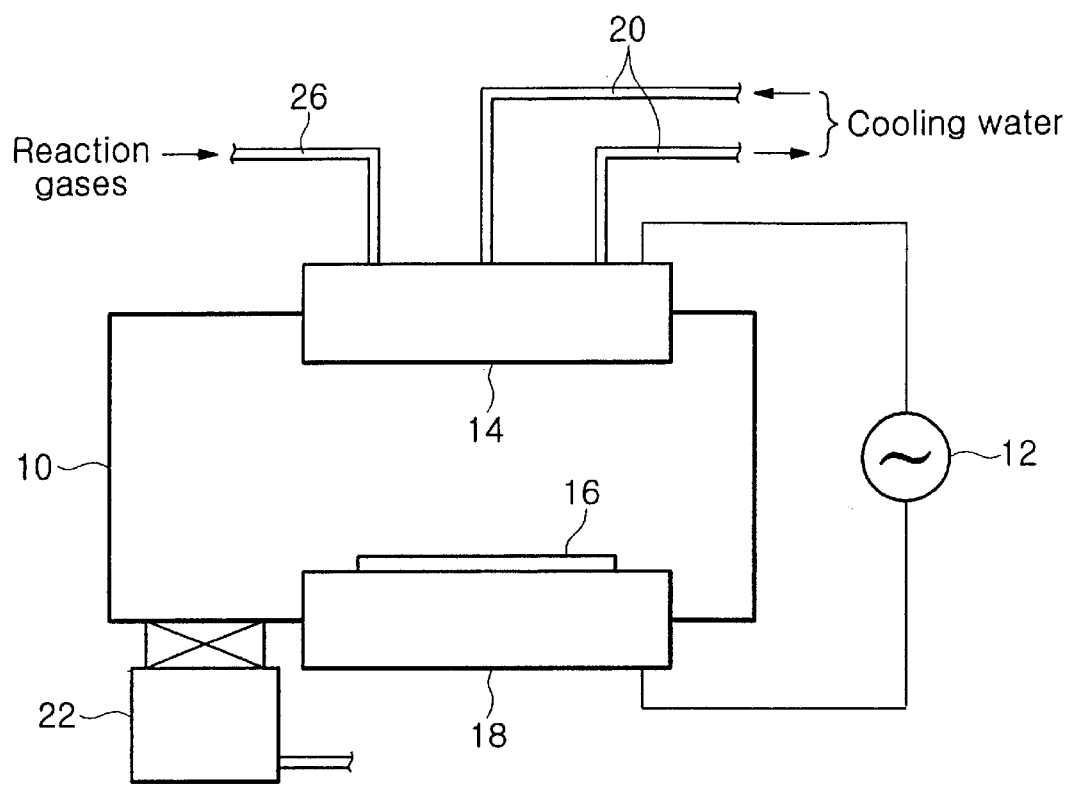
FIG. 1 is a simplified schematic diagram showing a conventional plasma chamber.
Figure 2:
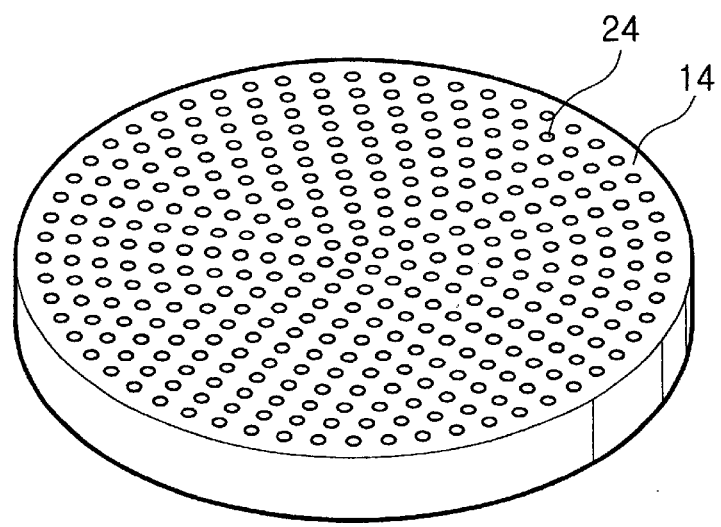
FIG. 2 is a perspective view of a cathode electrode which is disposed in the chamber of FIG. 1.

As the above described cleaning step (S10) is completed, the fabrication process of the circular plate substrate having the plurality of fine through holes as shown in FIG. 2 is completed.

Meanwhile, if necessary, a support ring is selectively coupled to the lower portion of the circular plate substrate 34 according to kinds of the plasma equipments (S12).

Lastly, a packaging step (S14) is performed to package the fabricated product. During the packaging step (S14), nitrogen gas is filled in a packaging wrapper to prevent particles of the outside to be introduced.

Figure 7:
FIG. 7 is a SEM photograph showing a section of a fine through hole of the cathode electrode of FIG. 2 formed by a conventional drilling method.
Figure 8:
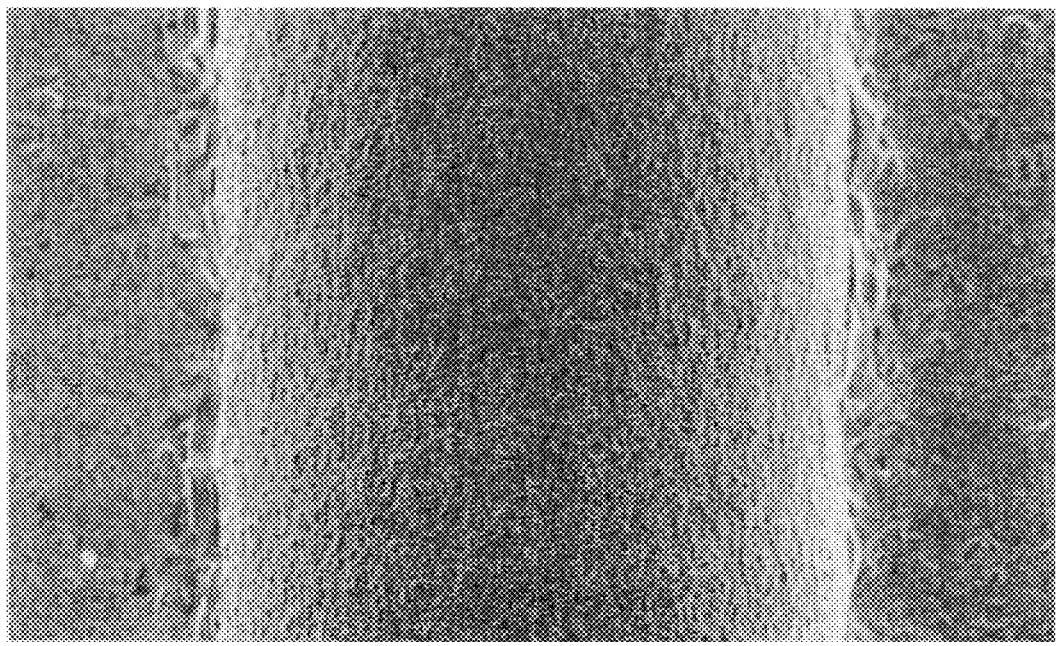
FIG. 8 is a SEM photograph showing a section of a fine through hole formed in a cathode electrode by an ultrasonic drilling method according to an embodiment of the present invention.

FIG. 7 is a SEM photograph showing a section of a fine through hole of the cathode electrode of FIG. 2 formed by a conventional drilling method; and FIG. 8 is a SEM photograph showing a section of a fine through hole formed in a cathode electrode by an ultrasonic drilling method according to an embodiment of the present invention.

When comparing FIG. 7 with FIG. 8, it is shown that the through hole formed by the conventional mechanical drilling method has a very rough surface compared with the through hole formed by the ultrasonic drilling method of the present invention. Thus, according to the present invention, the ultrasonic drilling method forms the through holes of the circular plate substrate for cathode electrode by colliding particles contained in the polishing material to selected portions of the circular plate substrate for the formation of the through holes by vibrating the circular plate substrate. As a result, a circular plate substrate having fine and flat surface and fine inner wall surface is obtained. Moreover, since the circular plate substrate is subject to three cleaning steps, remaining particles are fully removed. Thus, the present invention prevents particles from being generated during etch or deposition process using a plasma, resulting in improvement of yield.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for fabricating an electrode of a plasma chamber comprising the steps of:

providing a circular silicon substrate facing a drilling plate having a plurality of tips projected from one surface of the drilling plate;

supplying a polishing material containing a plurality of polishing particles on the circular silicon substrate and the drilling plate; and drilling a plurality of holes in the circular substrate by colliding the plurality of polishing particles to selected portions of the circular silicon substrate using an ultrasonic vibration of the tips of the drilling plate.

2. The method of claim 1, wherein the ultrasonic vibration of the tips of the drilling plate is performed by oscillation of a converter coupled to the other surface of the drilling plate.

3. A method for fabricating an electrode of a plasma chamber comprising the steps of:

providing a circular silicon substrate facing a drilling plate having a plurality of tips projected from one surface of the drilling plate;

supplying a first polishing material containing a plurality of polishing particles on the circular silicon substrate and the drilling plate;

drilling a plurality of holes in the circular silicon substrate by colliding the plurality of polishing particles to selected portions of the circular silicon substrate using an ultrasonic vibration of the tips of the drilling plate which is performed by oscillation of a converter coupled to the other surface of the drilling plate;

lapping the circular silicon substrate to a first roughness using a lapping material;

etching the circular silicon substrate using an etch solution;

polishing the circular silicon substrate to a second roughness lower than the first roughness using a second polishing material; and cleaning the circular silicon substrate.

4. The method of claim 3, wherein the first polishing material has a roughness of 9 Moh or more.

5. The method of claim 3, wherein the lapping material contains a plurality of lapping particles, the lapping particles having a diameter of 6–7 $\mu$m.

6. The method of claim 5, wherein the lapping material is one selected from a group consisting of silica, silicon carbide, alumina or zirconium.

7. The method of claim 3, wherein the etch solution is one selected from a group consisting of potassium hydroxide, nitric acid, and hydrochloric acid.

8. The method of claim 3, wherein the second polishing material contains a plurality of polishing particles, the polishing particles having a diameter of 0.1 $\mu$m or less.

9. The method of claim 8, wherein the second polishing material is one selected from a group consisting of silica, silicon carbide, alumina and zirconium.

10. The method of claim 3, wherein the cleaning step comprises:

dipping the circular silicon substrate in which the second polishing step is completed in a first cleaning solution wherein oxygenated water is added to a heated ammonia water;

dipping the circular silicon plate in a second cleaning solution wherein oxygenated water is added to a heated sulfric acid; and cleaning the circular substrate by deionized water.

* * * * *